United States Patent [19]

Yamane et al.

[11] Patent Number: 5,140,937
[45] Date of Patent: * Aug. 25, 1992

[54] APPARATUS FOR FORMING THREE-DIMENSIONAL ARTICLE

[75] Inventors: Mitsuo Yamane, Yotsukaichi; Takashi Kawaguchi, Aichi, both of Japan

[73] Assignee: Brother Kogyo Kabushiki Kaisha, Aichi, Japan

[*] Notice: The portion of the term of this patent subsequent to Oct. 22, 2008 has been disclaimed.

[21] Appl. No.: 527,446

[22] Filed: May 23, 1990

[30] Foreign Application Priority Data

May 23, 1989 [JP] Japan .................. 1-127849

[51] Int. Cl.$^5$ .......................... G06F 15/46; B05B 1/02
[52] U.S. Cl. .................... 118/695; 118/696;
118/313; 118/315; 118/318; 118/620;
156/273.3; 156/273.5; 156/275.5; 156/307.1;
364/468; 364/474.05; 364/474.24; 425/145;
425/150; 425/161; 425/174.4; 425/375

[58] Field of Search .............. 264/22, 25, 40.1, 40.7,
264/132, 219, 236, 245, 246, 255, 308, 347;
425/73, 135, 145, 150, 161, 174.4, 175, 375;
156/64, 242, 273.3, 273.5, 275.5, 307.1, 378,
500; 427/8, 12, 27, 407.1, 412.1; 118/50.1, 300,
313, 315, 318, 316, 620, 624, 698, 712, 695, 696;
101/35, 483; 346/1.1, 140 R; 364/468, 474.05,
474.24; 400/126

[56] References Cited

U.S. PATENT DOCUMENTS

| | | | |
|---|---|---|---|
| 4,400,705 | 8/1983 | Horike | 346/75 |
| 4,408,211 | 10/1983 | Yanada | 346/75 |
| 4,584,964 | 4/1986 | Engel | 118/696 |
| 4,641,270 | 2/1987 | Lalloz et al. | 364/476 |
| 4,665,492 | 5/1987 | Masters | 425/145 |
| 4,868,007 | 9/1989 | Taguchi | 118/696 |
| 4,915,757 | 4/1990 | Rando | 156/59 |
| 4,961,965 | 10/1990 | Dietz | 118/697 |
| 4,982,694 | 1/1991 | Moriyama | 118/697 |

Primary Examiner—Kenneth M. Schor
Assistant Examiner—Todd J. Burns
Attorney, Agent, or Firm—Oliff & Berridge

[57] ABSTRACT

An apparatus and a method for forming a three-dimensional article with thermosetting material on the basis of a three-dimensional information on the article by means of an ink jet method. The material is jetted from at least one ink jet head to a stage and laminated thereon. The laminated material is supplied with heat by a heat source so that it is cured. In this process, a jetting direction of the material from the ink jet head to the stage and/or a jetting amount of the material jetted from the ink jet head is changed in accordance with the information by a control unit, thereby forming a solid article having a desired three-dimensional shape.

9 Claims, 3 Drawing Sheets

APPARATUS FOR FORMING THREE-DIMENSIONAL ARTICLE

BACKGROUND OF THE INVENTION

This invention relates to an apparatus and a method for forming a solid or three-dimensional article, and more particularly to an apparatus and a method for forming a three-dimensional article in which thermosetting material is jetted by an ink jetting method, and cured by applying heat to the material while sequentially or intermittently laminated on a stage, thereby to form a solid or three-dimensional article on the stage.

There has been conventionally utilized an apparatus using photocurable material as shown in FIG. 1, a well-known injection molding apparatus and a cutting tool in order to form a three-dimensional article using resin material.

In the conventional apparatus as shown in FIG. 1, a three-dimensional model for a solid article (a three-dimensional information on the article) is beforehand obtained by means of CAD (Computer Aided Design). The three-dimensional model is sliced into plural thin sectional layers (informations) each representing each of plural sectional articles whose assembly constitutes the solid or three-dimensional article. In accordance with data of each thin sectional layer, a control computer 61 drives an X, Y-axes control device 62 for controlling a movement of a laser source 64 on a X-Y plane and a Z-axis control device 63 for controlling a movement of the laser source 64 in the Z-direction. Simultaneously with the driving of the X, Y-axes control device 62 and the Z-axis control device 63, the laser light source 64 irradiates a laser beam to the surface of liquid photosetting resin 66 accommodated in a tank 65 while scanning the surface of the photosetting resin 66 and drawing a pattern representing the sectional shape of each sectional article on the liquid surface of the resin 66 in accordance with the data from the control computer 61 with the laser beam. A table 68 is provided in the tank 65 in such a manner as to be disposed beside the surface of the resin 66. The laser beam is irradiated toward the table, and thus the photosetting resin 66 which is exposed to the laser beam is phase-changed from liquid to solid on the table 68, that is, the photosetting resin 66 is cured on the table 68 by the laser beam, so that a sectional article corresponding to one sectional layer of the sliced three-dimensional model is formed of the resin on the table 68 in the tank 65.

The table 68 is moved downwardly (in the Z-direction) by a distance corresponding to the thickness of one sectional article, and the above process is repeated to form a next sliced sectional article on the previously formed sliced article. A number of sliced sectional articles are sequentially formed and laminated by the above process, so that a cured solid article 69 is finally formed on the table 68.

In the conventional apparatus thus constructed, as described above, the liquid photosetting resin is accommodated in the tank and the laser beam is applied to the photosetting resin accommodated in the tank. Therefore, the material such as photosetting resin for the article to be formed is limited to only a single material. This limitation of the material also causes the color of the article to be limited to one color. If the material of the article or the color thereof is required to be changed on the way of the process, it is necessary to discharge the whole liquid photosetting resin from the tank and exchange it for a new one. Accordingly, in this case, a cleaning process for the inside of the tank is further required. This cleaning process causes a loss of time and a unnecessary cost. Further, it is very difficult to control polymerization of the resin in such an apparatus.

Further, in the conventional injection molding apparatus, an injection mold for forming a resin article must be beforehand formed, so that time and cost required for forming the article are more increased. In addition, the following disadvantages occur in this apparatus: a number of molds are required for a specific case, for example, when a number of kinds, but small quantity of articles are formed, but this apparatus is not suitable for such a case; various undesired portions such as a runner portion occur for a completed resin article, so that the resin at these portions must be removed from the article; an article having a hollow has a large limitation in structure; and much time for altering a material for the article are required. Accordingly, an article having a complicated structure can not be easily and accurately formed for a short time at low cost by this apparatus.

Still further, the cutting tool causes a large amount of scraps of the resin, so that a large amount of the resin of the article are left over which is undesired. In addition, the finally completed article is soiled by the scraps, so that the article can not be accurately formed. In comparison with the injection molding apparatus and so on, this cutting tool requires more time for a forming process, and thus is not suitable for a manufacturing process for forming a large amount of articles.

SUMMARY OF THE INVENTION

An object of this invention is to provide an apparatus and a method capable of easily and accurately forming a three-dimensional article for a short time and at a low cost even if plural materials of different kinds or colors are used.

Another object of this invention is to provide an apparatus and a method for forming a three-dimensional article capable of preventing dripping and blurring of materials used for the article during a laminating process thereof.

In order to attain the above objects, according to one aspect of this invention, an apparatus for forming a three-dimensional article with thermosetting material on the basis of a three-dimensional information on the article, comprises a stage for mounting thereon the three-dimensional article to be formed, an ink jet head unit having plural ink jet heads for sequentially or intermittently jetting the thermosetting material in a droplet form along a flight passage of the material to the stage to laminate the thermosetting material on the stage, the flight passage being defined between the stage and the ink jet head unit, an heat supplying unit for supplying the laminated material on the stage to heat to cure the material and a control unit for changing at least one of a jetting direction of the material jetted along the flight passage and a jetting amount of the material jetted from the ink jet head unit on the basis of the information to thereby control a jetting operation of the material.

In the three-dimensional article forming apparatus thus constructed, the ink jet head unit is preferably disposed under the stage so as to upwardly jet the resin to the stage.

According to another aspect of this invention, a method for forming a three-dimensional article with thermosetting material on the basis of a three-dimensional information on the article, comprises the steps of jetting the material along a flight passage of the material to a stage to thereby laminate the material on the stage, changing at least one of a jetting direction of the material along the flight passage and a jetting amount of the material, thereby controlling a jetting operation of the material, and heating the laminated material to cure the material, thereby forming the article.

According to this invention, since plural ink jet heads are provided, a thermosetting resin material for the three-dimensional article can be exchanged for another even during an article forming process. Further, as the resin is jetted in a droplet form, polymerization of the resin is easily controlled.

Moreover, according to this invention, since the ink jet head is disposed under the stage, the resin is jetted from a downward side to an upward side and is cured every jetting process. Accordingly, there is an advantage that a resin for which the previously used resin is exchanged in the course of the process is not mixed with the previously used resin, and thus the forming process is accurately performed with no drop of the resin.

DETAILED DESCRIPTION OF THE INVENTION

Figure 1:
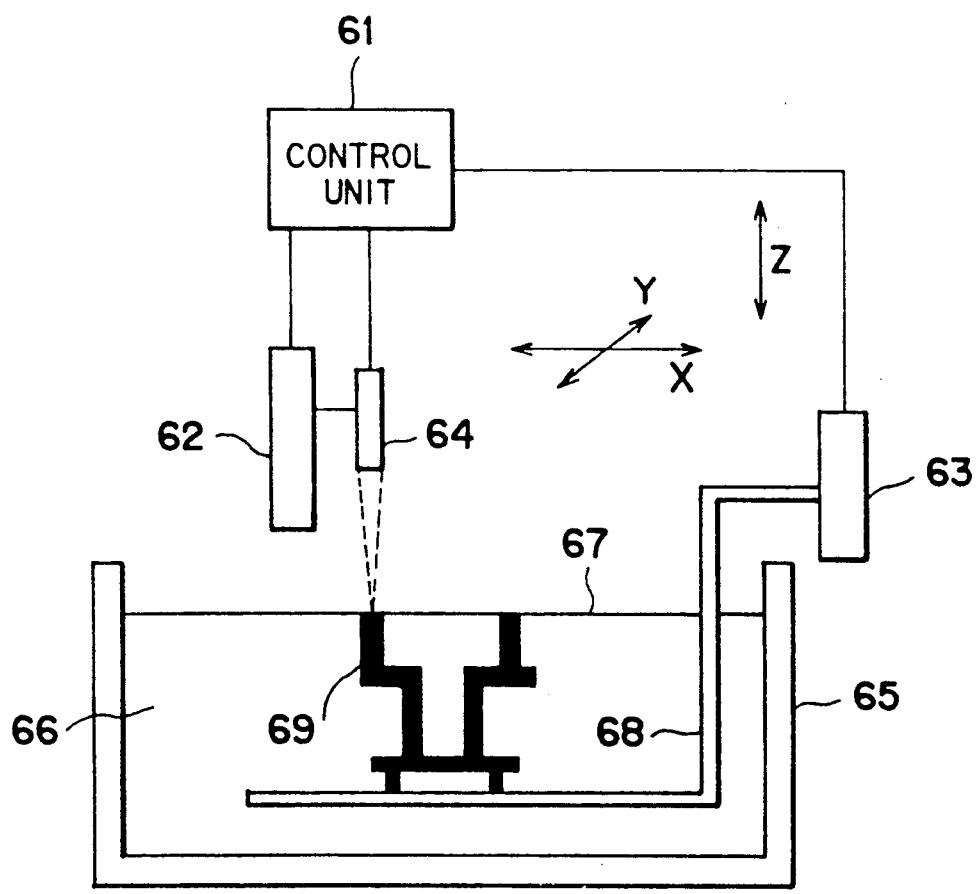
FIG. 1 is a schematic view of a conventional three-dimensional article forming apparatus.
Figure 2:
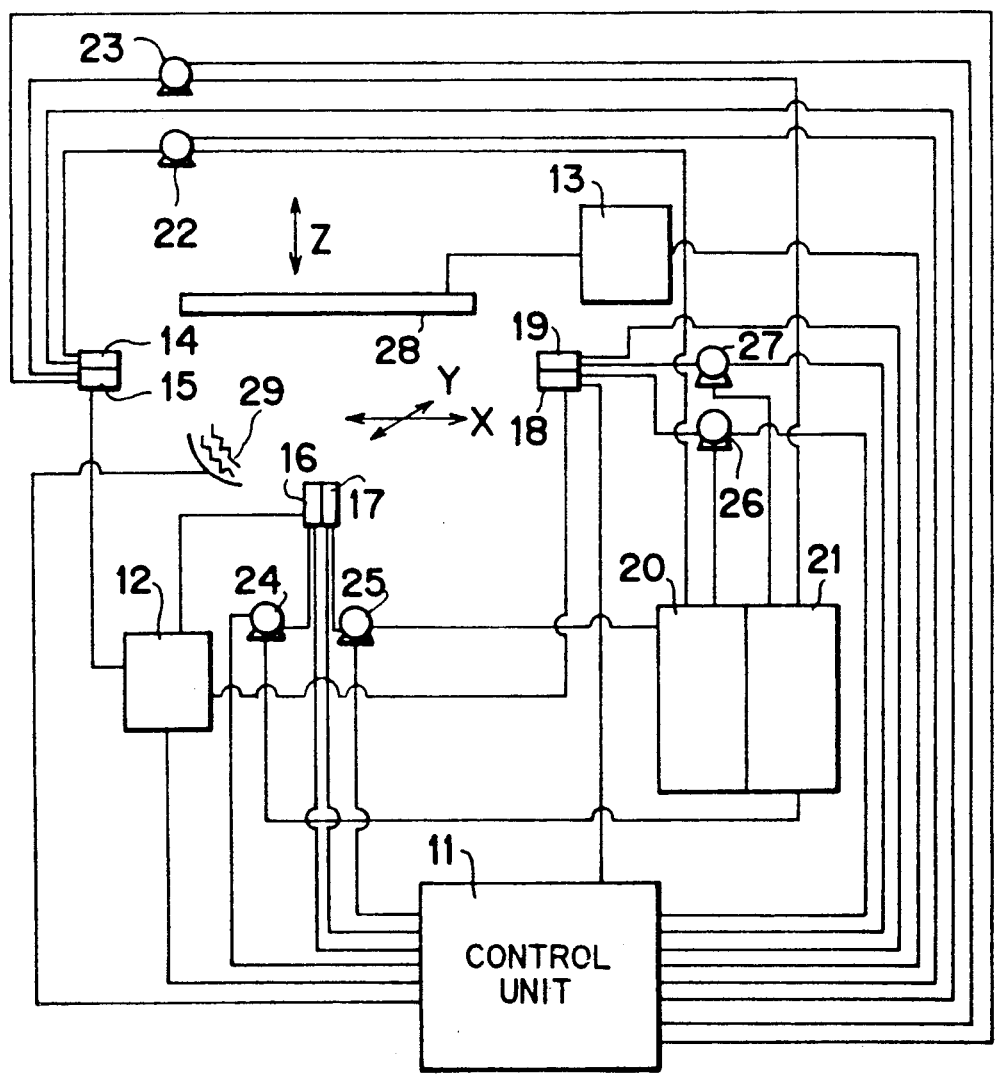
FIG. 2 is a schematic view of an embodiment of a three-dimensional article forming apparatus according to this invention.

A preferred embodiment of this invention will be described hereunder with reference to the accompanying drawings A three-dimensional article forming apparatus according to a first embodiment is shown in FIG. 2, and basically comprises a control unit 11 comprising a computer for obtaining a three-dimensional model on the basis of an input information on a desired article and controlling each element of the apparatus for performing a forming process in accordance with data on the model, a forming stage 28 on which a material such as thermosetting resin is laminated to form a three-dimensional (solid) article thereon, a heat source 29 for supplying heat to the laminated thermosetting resin and curing the resin, an ink jet head unit having plural ink jet heads 14 to 19 for jetting the thermosetting resin to the stage 28, an X, Y-axes control device 12 for controlling a movement of the ink jet head unit in the X- and Y-directions (on the X-Y plane) and a Z-axis control device 13 for controlling a movement of the forming stage in the Z-direction, the X, Y-axes and Z-axis control devices 12 and 13 being used to control jetting and laminating directions of the photosetting resin, resin tanks 20 and 21 for accommodating the thermosetting resin, and pumps 22 to 27 for providing the thermosetting resin in the tanks 20 and 21 to the ink jet head unit.

Figure 6:
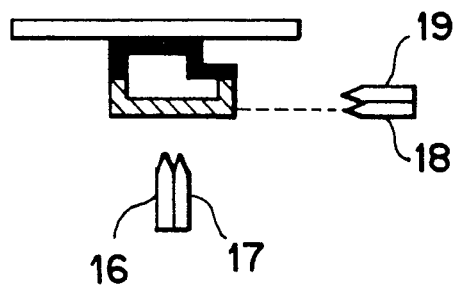

An operation of the apparatus according to this embodiment will be described hereunder, for example, in a case where an article as shown in FIG. 6 is formed.

Figure 3:
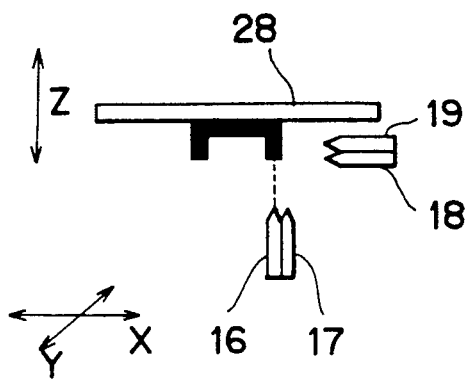
FIGS. 3 to 6 are explanatory views for forming an article using the apparatus as shown in FIG. 2.

At a first stage, data on each sectional shape of a desired article is inputted to the control unit 11. On the basis of an instruction from the control unit 11, the X, Y-axes control device 12 and the Z-axis control device 13 are driven to move the ink jet heads 14 to 19 and the forming stage 28 disposed above the ink jet heads to predetermined positions, respectively. After these elements are moved, the control unit 11 outputs an instruction to the pump 24 to jet thermosetting resin A accommodated in the tank 21 from the ink jet head 16 to the forming stage 28 while the ink jet head 16 is moved in the X- and Y-directions, and to laminate the jetted thermosetting resin on the forming stage 28. Thereafter, the laminated thermosetting resin is supplied with heat by the heat source 29 to be cured, so that a first part of the article as shown in FIG. 3 is obtained on the stage 28.

Figure 4:
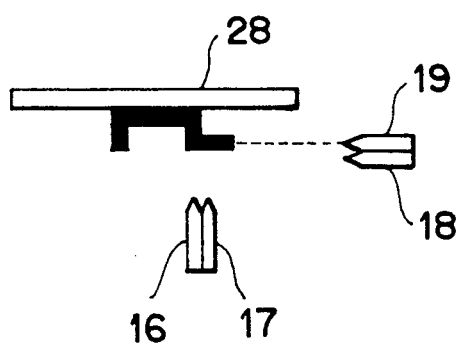
Figure 5:
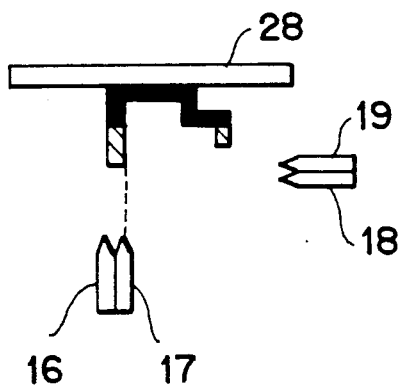

At a next stage, the control unit 11 outputs another instruction to the pumps 23 and 27 to jet the thermosetting resin A accommodated in the tank 21 from the ink jet heads 15 and 19 to the stage 28 while the ink jet heads 15 and 19 are moved in the X- and Y-directions (in this embodiment, it is not necessary to jet the thermosetting resin from the ink jet head 15 because of the shape of the article to be formed). The thermosetting resin is laminated on the previously-cured first part and then cured by supplying heat to the resin from the heat source 29, so that a second part as shown in FIG. 4 is formed on the first part. Further, in accordance with another instruction from the control unit 11, the forming stage 28 is moved in the Z-direction by a distance corresponding to the thickness of each sectional article, and the ink jet heads 16 and 17 are moved in the X- and Y-directions. Thereafter, the thermosetting resin B accommodated in the tank 20 is jetted from the ink jet head 17 while the ink jet head 17 is moved in the X- and Y-directions, and laminated on the previously-cured first and second parts. The thermosetting resin is cured by the heat supply from the heat source 29 to form a third part as shown in FIG. 5 on the first and second parts.

At a last stage, the control unit 11 outputs another instruction to the pumps 22 and 26 to jet the thermosetting resin B accommodated in the tank 20 from the ink jet heads 14 and 18 to the stage 28 while the ink jet heads 14 and 18 are moved in the X- and Y-directions (in this embodiment, it is not necessary to jet the thermosetting resin from the ink jet head 14 because of the shape of the article to be formed), and then the thermosetting resin is laminated on the previously-cured third part. The thermosetting resin is cured by the heat supply from the heat source 29 to form a fourth part as shown in FIG. 6, that is, the desired article as shown in FIG. 6 is formed on the stage 28 and the forming process is completed. In the above embodiment, the thermosetting resins A and B may be different in kinds and/or colors from each other.

The thermosetting resins A and B are selected from materials which have the following property (1), (2) or (3).

(1) Materials cured through oxidation polymerization reaction by heat. For example, drying oil, semi-drying oil, epoxy ester or the like may be used.

(2) Material cured through condensation polymerization reaction by heat. For example, amino resin such as melamine resin, urea resin or the like may be used.

(3) Material cured through addition reaction by heat. For example, epoxy resin such as bisphenol A type epoxy resin or the like may be used.

These resins are selected in consideration of viscosity, rate of reaction, efficiency of reaction and so on. Further, a photosensitizer, a stabilizer, a reactive diluent and so on are added in a suitable mixing ratio. Further, by using various dyes or various different color or kind thermosetting resins, a multi-kind or multi-color article may be used.

This invention is not limited to the above embodiment, and any modification may be used insofar as the modifications do not depart from the subject matter of this invention. For example, if a CAD/CAM/CAE system is introduced into the control unit 11 as described above, it is possible to increase a speed for the forming process and to improve a quality in design.

In the above embodiment, the ink jet head unit comprises three arrays of ink jet heads, each of which comprises two ink jet heads for jetting the different photosetting resins A and B accommodated in the tanks 20 and 21. However, the number of ink jet heads constituting an array and the number of the arrays constituting the ink jet head unit are not limited to the above embodiment.

In the above embodiment, the ink jet heads are controlled by the control unit to adjust the jetting direction of the resin. However, the ink jet heads may be also controlled by the control unit to adjust the jetting amount of the resin. As a means for changing the jetting amount of the resin, each ink jet head comprises at least two ink heads having a large jetting amount for resin and a small jetting amount of resin. The jetting amount of the ink jet head can be adjusted by performing a switching operation between the two ink heads. Of course, the means is not limited to this manner.

In this embodiment, the array of the ink jet heads 14 and 15 and the array of the ink jet heads 18 and 19 are moved along the X- and Y-axes by the X, Y-axes control device 12. However, by further providing to the apparatus a rotational movement control device (not shown) for rotating these arrays, these arrays may be rotated around the stage on a plane parallel to the surface of the stage independently of the movement along the X, Y-axes.

What is claimed is:

1. An apparatus for forming a three-dimensional article with thermosetting material on the basis of three-dimensional information on the article, the apparatus comprising:
    a stage for mounting thereon the three-dimensional article to be formed;
    an ink jet head unit positioned below the stage for jetting the thermosetting material along a flight passage of the material to said stage to laminate the thermosetting material on said stage, the flight passage being defined between said stage and said ink jet head unit;
    a heat supplying unit for heating the thermosetting material laminated on said stage to cure the thermosetting material; and
    control means for controlling said ink jet head unit in order to change at least one of a jetting direction of the thermosetting material along the flight passage and a jetting amount of the thermosetting material jetted from said ink jet head unit on the basis of the information in order to control jetting and laminating operation of the thermosetting material on said stage, and for controlling said heat supplying unit in order to cure thermosetting material laminated on the stage after the thermosetting material is laminated on said stage, said controlling means also controlling the repetition of the jetting and laminating operation of said ink jet head unit and the thermosetting operation of said heat supplying unit.

2. An apparatus as claimed in claim 1, wherein said ink jet head unit comprises at least two arrays of ink jet heads for laminating the material on the stage in different directions to each other, respectively.

3. An apparatus as claimed in claim 2, wherein said control unit includes first driving means for moving each of said arrays in two directions perpendicular to each other on a plane parallel to the surface of said stage, and second driving means for moving said stage in a direction perpendicular to the plane.

4. An apparatus as claimed in claim 2, wherein said control unit includes first driving means for moving one of said arrays in two directions perpendicular to each other and second driving means for rotating the other array relatively to said stage around an axis perpendicular to the surface of said stage.

5. An apparatus as claimed in claim 4, wherein said control unit further includes third driving means for moving said stage in a direction perpendicular to the plane.

6. An apparatus as claimed in claim 4, wherein said control unit further includes third driving means for moving said stage in a direction perpendicular to the plane and rotating said stage around the axis.

7. An apparatus as claimed in claim 1, wherein said ink jet head unit is disposed under said stage so as to upwardly jet the material to the stage.

8. An apparatus as claimed in claim 1, wherein the three-dimensional information on the article comprises plural sectional positional data each representing a sliced sectional part of the article and a color data representing a color of the article to be formed.

9. An apparatus for forming a multi-kind or multi-color three-dimensional article with plural thermosetting materials of different kinds or different colors on the basis of three-dimensional information on the article, the apparatus comprising:
    a stage for mounting thereon the three-dimensional article to be formed;
    plural tanks for accommodating the different kind or color thermosetting materials;
    plural ink jet heads positioned below said stage for jetting along respective flight passages of the thermosetting materials toward said stage to individually laminate the thermosetting materials on said stage, the flight passages being defined between said stage and said ink jet heads;
    a heat supplying unit for heating the laminated thermosetting materials on said stage to cure the thermosetting materials; and
    control means for controlling said ink jet heads in order to change at least one of a jetting direction of the thermosetting materials jetted along the flight passages and a jetting amount of the thermosetting materials jetted from said ink jet head unit on the basis of the information to control jetting and laminating operation of the ink jet heads, and for controlling said heat supplying unit in order to cure the thermosetting materials laminated on said stage after the thermosetting materials are laminated on said stage, said controlling means also controlling the repetition of the jetting and laminating operation of said ink jet heads and the curing operation of said heat supplying unit.

* * * * *